US009327597B2

(12) United States Patent
Kimura

(10) Patent No.: US 9,327,597 B2
(45) Date of Patent: May 3, 2016

(54) SOLAR BATTERY MOUNTING STRUCTURE

(71) Applicant: TOYOTA JIDOSHA KABUSHIKI KAISHA, Toyota-shi, Aichi (JP)

(72) Inventor: Kazutaka Kimura, Susono (JP)

(73) Assignee: TOYOTA JIDOSHA KABUSHIKI KAISHA, Toyota-Shi (JP)

( * ) Notice: Subject to any disclaimer, the term of this patent is extended or adjusted under 35 U.S.C. 154(b) by 0 days.

(21) Appl. No.: 14/630,035

(22) Filed: Feb. 24, 2015

(65) Prior Publication Data

US 2015/0239342 A1    Aug. 27, 2015

(30) Foreign Application Priority Data

Feb. 27, 2014    (JP) .................................. 2014-037522

(51) Int. Cl.
| B60R 16/00 | (2006.01) |
| B60K 16/00 | (2006.01) |
| H02S 10/40 | (2014.01) |
| H01L 31/049 | (2014.01) |
| B62D 25/06 | (2006.01) |
| B62D 29/04 | (2006.01) |
| H01L 31/043 | (2014.01) |
| B62D 27/02 | (2006.01) |

(52) U.S. Cl.
CPC .............. *B60K 16/00* (2013.01); *B62D 25/06* (2013.01); *B62D 29/043* (2013.01); *H01L 31/043* (2014.12); *H01L 31/049* (2014.12); *H02S 10/40* (2014.12); *B60K 2016/003* (2013.01); *B62D 27/026* (2013.01); *Y02T 10/90* (2013.01)

(58) Field of Classification Search
CPC .. B60K 16/00; B60K 2016/003; B62D 25/06; B62D 27/026; B62D 29/043; H01L 31/043; H01L 31/049; H02S 10/40; Y02T 10/90
See application file for complete search history.

(56) References Cited

U.S. PATENT DOCUMENTS

| 4,090,577 | A | * | 5/1978 | Moore | ..................... B60K 6/28 |
| | | | | | 105/50 |
| 4,461,922 | A | * | 7/1984 | Gay | ...................... H01L 31/048 |
| | | | | | 136/249 |
| 4,638,111 | A | * | 1/1987 | Gay | .................... H01L 31/0392 |
| | | | | | 136/249 |
| 5,680,907 | A | * | 10/1997 | Weihe | ..................... B60K 8/00 |
| | | | | | 180/15 |
| 5,779,817 | A | * | 7/1998 | Wecker | ...................... B60J 7/04 |
| | | | | | 136/244 |

(Continued)

FOREIGN PATENT DOCUMENTS

| DE | 3835560 A1 * | 4/1990 | .............. B62D 25/06 |
| DE | 102007052554 A1 * | 5/2009 | .............. B60L 8/003 |

(Continued)

*Primary Examiner* — Glenn Dayoan
*Assistant Examiner* — Paul Chenevert
(74) *Attorney, Agent, or Firm* — Kenyon & Kenyon LLP

(57) ABSTRACT

A solar battery mounting structure including a solar battery module which frame includes a light transmissive plate member, an adhesive portion by which a lower surface of a side end portion of the light transmissive plate member is adhered to an adhesive surface of a vehicle body frame member, and a fixation portion which is fixed to a lower surface of the light transmissive plate member through a sealing material layer, and is fixed to a fixation surface of the vehicle body frame member facing the lower surface, a protrusion portion in contact with the lower surface of the light transmissive plate member through the sealing material layer is fainted in the fixation portion, and frame a step portion is formed between the adhesive surface and the fixation surface.

5 Claims, 9 Drawing Sheets

(56) References Cited

U.S. PATENT DOCUMENTS

| | | | |
|---|---|---|---|
| 6,283,542 B1 | 9/2001 | Patz | |
| 6,439,654 B1 * | 8/2002 | Teschner | B60J 7/00 296/211 |
| 6,971,704 B2 * | 12/2005 | Cocaign | B62D 25/06 296/215 |
| 7,985,919 B1 * | 7/2011 | Roscheisen | H01L 31/0392 136/246 |
| 9,126,392 B1 * | 9/2015 | Nielson | H01L 31/068 |
| 9,242,554 B2 * | 1/2016 | Shima | B60K 16/00 |
| 2001/0039960 A1 * | 11/2001 | Shugar | B60L 8/003 136/244 |
| 2005/0001456 A1 * | 1/2005 | Bohm | B32B 17/10018 296/215 |
| 2005/0029839 A1 * | 2/2005 | Stemmer | B62D 25/06 296/215 |
| 2007/0002422 A1 * | 1/2007 | O'Shaughnessy | G02F 1/153 359/265 |
| 2008/0230112 A1 * | 9/2008 | Barnham | H01L 31/061 136/249 |
| 2008/0272625 A1 * | 11/2008 | Paetz | B62D 25/06 296/216.09 |
| 2009/0173382 A1 * | 7/2009 | Yagiura | H01L 31/049 136/256 |
| 2011/0226312 A1 * | 9/2011 | Bohm | B32B 15/08 136/251 |
| 2012/0133322 A1 * | 5/2012 | Walsh | B60L 8/00 320/101 |
| 2014/0174509 A1 * | 6/2014 | Bonekamp | B32B 27/32 136/251 |
| 2014/0251415 A1 * | 9/2014 | Inaba | H01L 31/048 136/251 |
| 2015/0129325 A1 * | 5/2015 | Shirai | H01L 31/048 180/2.2 |
| 2015/0145289 A1 * | 5/2015 | Inaba | B32B 17/10 296/210 |
| 2015/0155399 A1 * | 6/2015 | Mu | H01L 31/049 136/256 |
| 2015/0183327 A1 * | 7/2015 | Lee | B60L 11/1809 701/49 |
| 2015/0197150 A1 * | 7/2015 | Shirai | B60K 16/00 180/2.2 |
| 2015/0285290 A1 * | 10/2015 | Roehrl | B62D 27/026 411/82 |

FOREIGN PATENT DOCUMENTS

| | | | |
|---|---|---|---|
| GB | 1227417 A * | 4/1971 | B62D 25/06 |
| JP | H1-167916 U | 11/1989 | |
| JP | H03-117854 U | 12/1991 | |
| JP | 2000-001124 A | 1/2000 | |
| JP | 2000-068539 A | 3/2000 | |
| JP | 2000-352175 A | 12/2000 | |
| JP | 2002-043608 A | 2/2002 | |
| JP | 2006-168531 A | 6/2006 | |
| JP | 2010-129691 A | 6/2010 | |
| JP | 2010-137809 A | 6/2010 | |
| JP | 2015-008175 A | 1/2015 | |

* cited by examiner

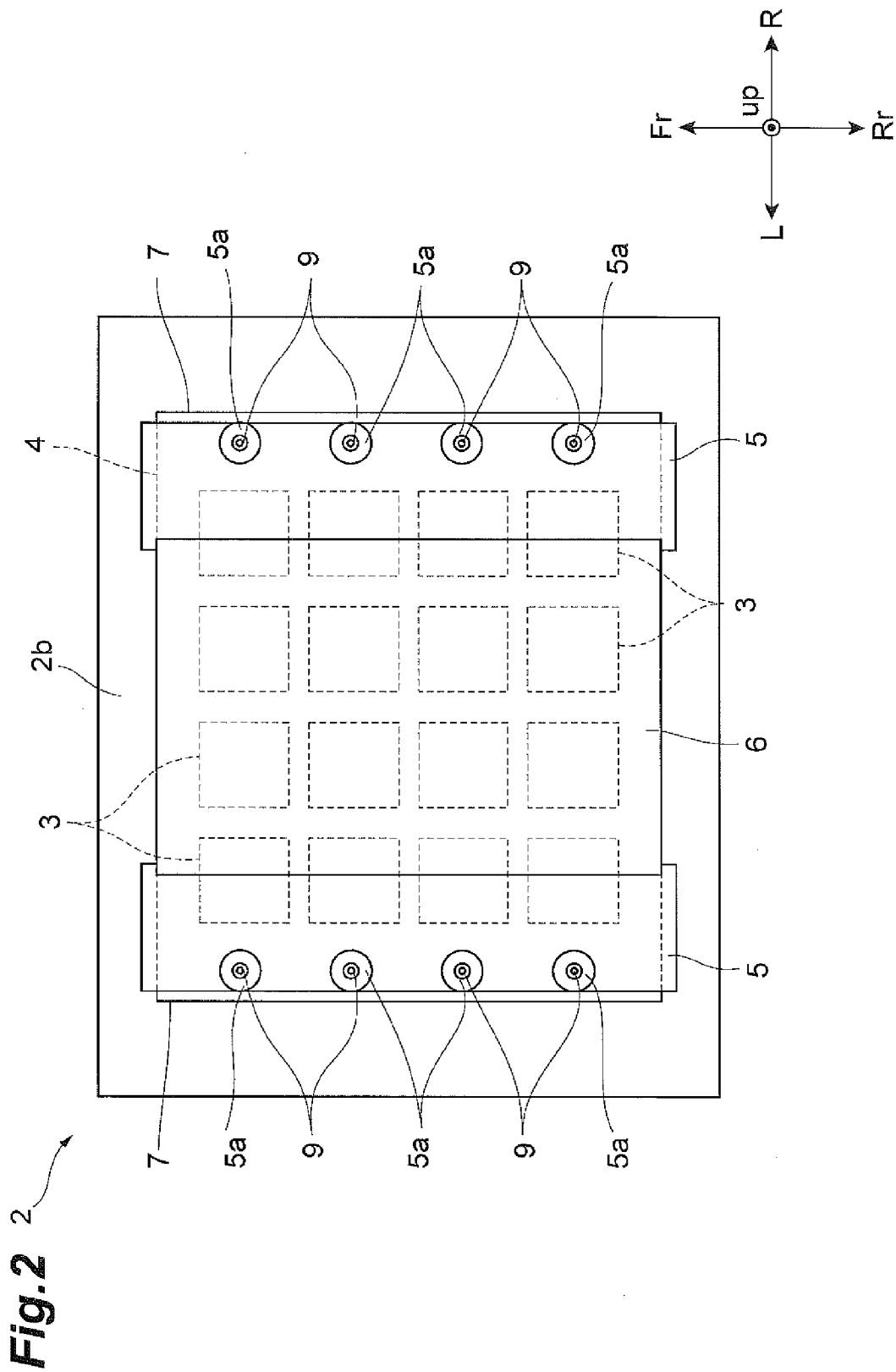

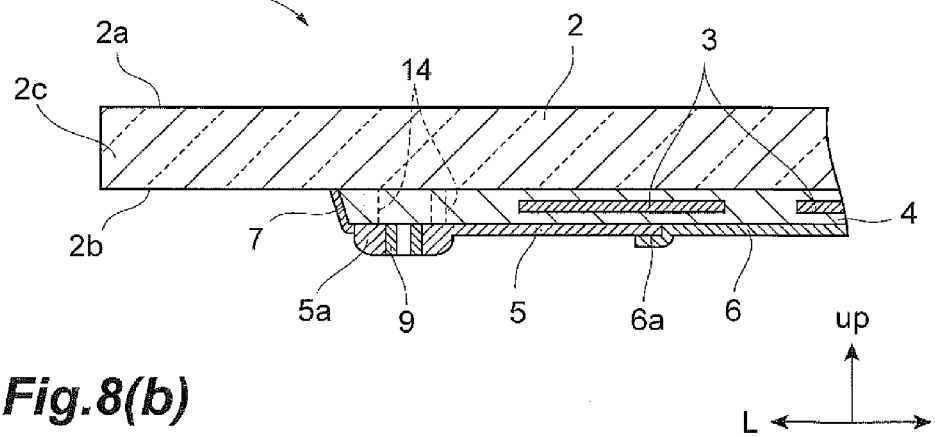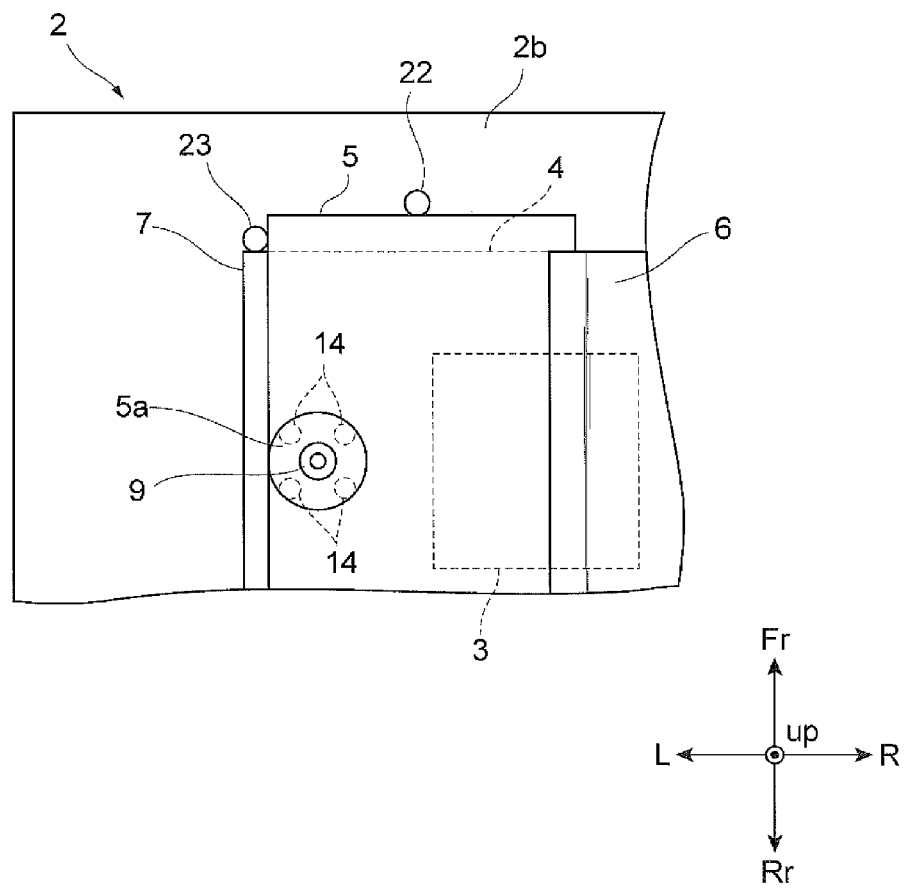

SOLAR BATTERY MOUNTING STRUCTURE

CROSS-REFERENCE TO RELATED APPLICATION

The present application claims priority to Japanese Patent Application No. 2014-037522 filed on Feb. 27, 2014, which is incorporated herein by reference in its entirety.

BACKGROUND OF THE INVENTION

1. Field of the Invention

The present invention relates to a solar battery mounting structure including a solar battery module fixed to a vehicle body frame member.

2. Related Background Art

In the related art, for example, Japanese Unexamined Patent Application Publication No.2010-137809 is known as Technical Literature relevant to a vehicle body mounting structure of a solar battery cell. In Japanese Unexamined Patent Application Publication No. 2010-137809, a vehicle upper portion structure including a solar battery cell which is disposed in an upper portion of a front window of a vehicle and/or an upper portion of a rear window of the vehicle, and receives light from both a vehicle exterior side and a vehicle interior side and converts the light into electrical energy, is disclosed.

Japanese Unexamined Utility Model Registration Application Publication No. 3-117854, Japanese Unexamined Patent Application Publication No. 2002-043608, Japanese Unexamined Patent Application Publication No. 2000-352175, and Japanese Unexamined Patent Application Publication No. 2000-068539 are examples of the related art.

However, the solar battery cell may be used in a configuration of the solar battery module including a light transmissive plate member such as glass on which solar light is incident from an upper surface, and a sealing material layer which is disposed on a lower surface side of the light transmissive plate member and includes the solar battery cell therein. When such a solar battery module is disposed in an upper surface of a vehicle body, the solar battery module is usually mounted on (fixed to) the vehicle body due to adhesion between the light transmissive plate member such as glass and the vehicle body frame member (for example, a roof side rail).

On the other hand, on the basis of a demand for a reduction in weight of the vehicle from the market, there is a demand for a reduction in a thickness of the light transmissive plate member. However, the reduction in the thickness of the light transmissive plate member which is adhered to the vehicle body frame member causes a decrease in impact resistance of the solar battery module, and thus an improvement for ensuring the impact resistance is required.

Therefore, in this technical field, there is a demand for providing a solar battery mounting structure by which impact resistance of the solar battery module is able to be ensured.

The present invention is made in consideration of the circumstances described above, and according to one aspect of the invention, a solar battery mounting structure including a solar battery module which is disposed in an upper surface of a vehicle body and is fixed to a vehicle body frame member, in which the solar battery module includes a light transmissive plate member which is arranged along the upper surface of the vehicle body, an adhesive portion by which a lower surface of a side end portion of the light transmissive plate member is adhered to an adhesive surface of the vehicle body frame member, and a fixation portion which is fixed to a lower surface of the light transmissive plate member through a sealing material layer, and is fixed to a fixation surface of the vehicle body frame member facing the lower surface, a protrusion portion which is in contact with the lower surface of the light transmissive plate member through the sealing material layer is formed in the fixation portion, and in the vehicle body frame member, a step portion is formed between the adhesive surface and the fixation surface, and the fixation surface is separated from the lower surface of the light transmissive plate member compared to the adhesive surface is provided.

In the solar battery mounting structure, the light transmissive plate member is adhered to the adhesive surface of the vehicle body frame member, and further, the fixation portion is fixed to the fixation surface of the vehicle body frame member, and thus it is possible to increase a fixation point (a connection point) between the vehicle body frame member and the solar battery module, and it is possible to ensure impact resistance of the solar battery module compared to the related art in which only the light transmissive plate member is fixed to the vehicle body frame member. In addition, in the solar battery mounting structure, the protrusion portion which is in contact with the lower surface of the light transmissive plate member through the sealing material layer is formed in the fixation portion, and thus, for example, the fixation portion sinks in the sealing material layer at the time of manufacturing the solar battery module, and it is possible to avoid displacement in a position of the fixation portion. In addition, in the solar battery mounting structure, the step portion is formed between the adhesive surface and the fixation surface, and the fixation surface is separated from the lower surface of the light transmissive plate member compared to the adhesive surface, and thus it is possible to ensure a space for disposing the fixation portion in the sealing material layer compared to a case where the step portion is not included. Accordingly, in the solar battery mounting structure, it is possible to ensure impact resistance of the solar battery module by fixing a portion other than the light transmissive plate member to the vehicle body frame member, and thus it is advantageous for a reduction in a thickness of the light transmissive plate member. This contributes to a reduction in weight of the vehicle on which the solar battery module is mounted.

In one embodiment, the vehicle body frame member may include a body bracket protruding toward the fixation portion, and the fixation surface may be formed in the body bracket.

In the solar battery mounting structure, by including the body bracket in the vehicle body frame member, it is possible to form the fixation surface in a suitable position in the vehicle body having various shapes, and thus general versatility is improved.

In one embodiment, the fixation portion may include a resin member in which a nut is embedded, the fixation surface has a bolt hole opened therein, and the fixation portion may be fixed to the fixation surface by a bolt may be screwed into the nut through the bolt hole.

In the solar battery mounting structure, the nut and the bolt of the resin member are screwed in a state where a shaft portion of the bolt is inserted into the bolt hole in the fixation surface of the vehicle body frame member, and thus it is possible to fix the fixation portion of the solar battery module to the fixation surface of the vehicle body frame member in a comparatively easy configuration. In addition, in the solar battery mounting structure, the step portion is formed between the adhesive surface and the fixation surface in the vehicle body frame member, and thus it is possible to ensure an arrangement space of the nut by the step, and it is possible to obtain necessary strength by sufficiently taking a length for screwing the nut and the bolt.

In one embodiment, a plurality of positioning pins for positioning the fixation portion at the time of manufacturing the solar battery module may be disposed in the lower surface of the light transmissive plate member.

In the solar battery mounting structure, the fixation portion is positioned with respect to the lower surface of the light transmissive plate member by the plurality of positioning pins, and thus position displacement of the fixation portion is avoided at the time of forming the sealing material layer in manufacturing of the solar battery module. Accordingly, in the solar battery mounting structure, it is possible to suppress the position displacement of the fixation portion, and thus it is possible to improve stability of fixation between the solar battery module and the vehicle body frame member.

In one embodiment, a back sheet which is disposed on a side of the sealing material layer opposite to the light transmissive plate member may be further included.

According to the solar battery mounting structure, it is possible to improve strength of the sealing material layer by the back sheet which is disposed on the side of the sealing material layer opposite to the light transmissive plate member. This contributes to an improvement in durability of the solar battery module.

According to the solar battery mounting structure of the aspect and each of the embodiments of the invention, it is possible to ensure impact resistance of the solar battery module.

BRIEF DESCRIPTION OF THE DRAWINGS

FIG. 2 is a bottom view illustrating a solar battery module of FIG. 1.

FIG. 8(a) is an enlarged cross-sectional view of the solar battery module of FIG. 6, and FIG. 8(b) is an enlarged bottom view of the solar battery module of FIG. 7.

DESCRIPTION OF THE PREFERRED EMBODIMENTS

Hereinafter, preferred embodiments of the invention will be described in detail with reference to the drawings.

First Embodiment

Figure 1:
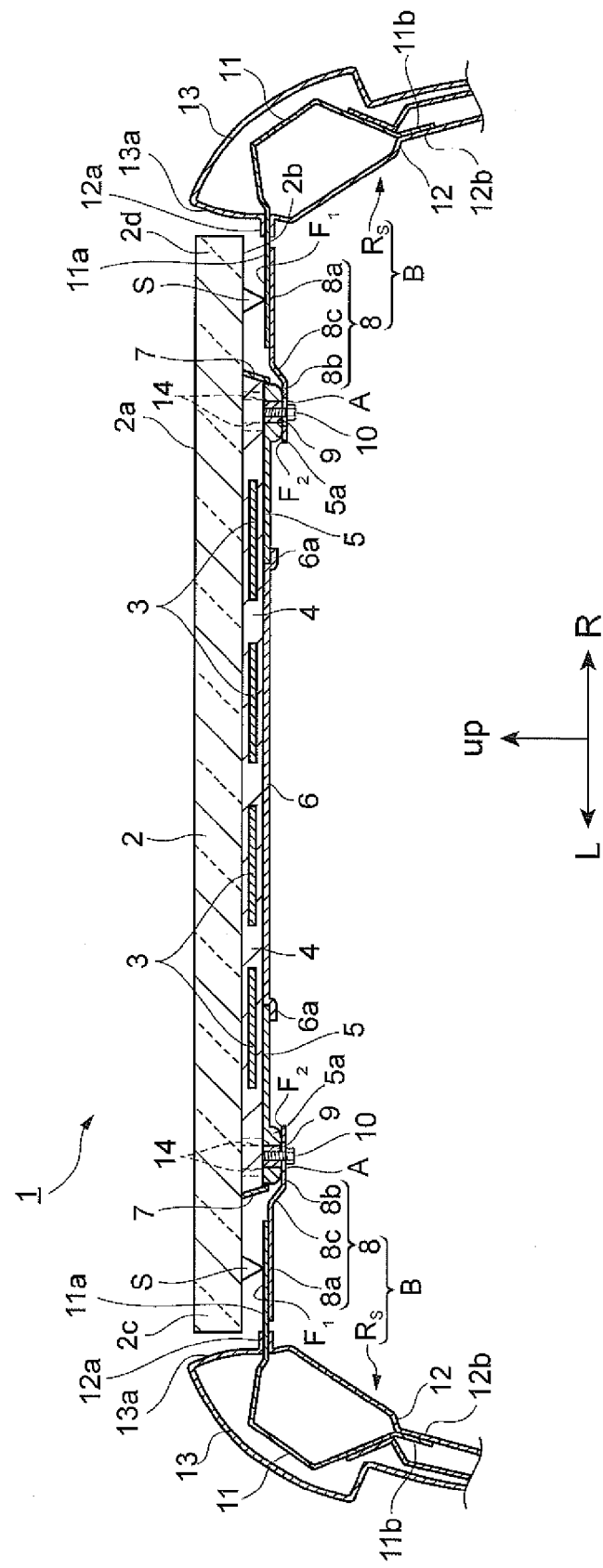
FIG. 1 is a cross-sectional view illustrating a solar battery mounting structure according to a first embodiment.

As illustrated in FIG. 1, a solar battery mounting structure according to a first embodiment is a structure for mounting a solar battery module 1 on a vehicle body. A type of the vehicle body including the solar battery module 1 mounted thereon is not particularly limited, and may be a vehicle body of a passenger vehicle, may be a vehicle body of a shared vehicle such as a bus, or may be a vehicle body of a freight vehicle such as a van or a truck. In FIG. 1, an upper direction UP, a left direction L, and a right direction R of the vehicle body are illustrated by arrows.

The solar battery module 1 is fixed to a vehicle body frame member B configuring the vehicle body. The vehicle body frame member B includes a roof side rail, a roof panel, a roof panel reinforcement, and the like, which constitute the vehicle body. Furthermore, the vehicle body frame member B to which the solar battery module 1 is fixed may include a front body pillar, a center body pillar, a side outer panel, and the like.

The solar battery module 1 according to the first embodiment is disposed in an upper surface of the vehicle body, and may configure a part of a roof of the vehicle body. Specifically, the solar battery module 1 is fixed to a pair of right and left roof side rails Rs configuring the vehicle body frame member B. The upper surface of the vehicle body, for example, is an upper surface of a roof panel (not illustrated) supported by the roof side rail Rs. The upper surface of the roof panel, for example, is positioned between upper ends of the pair of roof side rails Rs.

Hereinafter, a configuration of the roof side rail Rs will be described. The roof side rail Rs is configured by a roof side rail reinforcement 11 arranged on a vehicle exterior side, and a roof side inner rail 12.

An upper end portion 12a of the roof side inner rail 12 is overlapped with an upper end portion 11a of the roof side rail reinforcement 11. In addition, a lower end portion 11b of the roof side rail reinforcement 11 is overlapped with a lower end portion 12b of the roof side inner rail 12. A vertical cross section of the roof side rail reinforcement 11 and the roof side inner rail 12 forms a closed cross section. The upper end portion 11a side of the roof side rail reinforcement 11 extends toward an inner side (a cabin side) from the upper end portion 12a of the roof side inner rail 12.

In addition, a side outer panel 13 is arranged outside the roof side rail reinforcement 11. An upper end portion 13a of the side outer panel 13 is overlapped with the upper end portion 11a of the roof side rail reinforcement 11. That is, the upper end portion 11a of the roof side rail reinforcement 11 is interposed between the upper end portion 13a of the side outer panel 13 and the upper end portion 12a of the roof side inner rail 12 in a vertical direction.

The upper end portion 11a of the roof side rail reinforcement 11 protrudes toward the solar battery module 1 from the upper end portion 13a of the side outer panel 13 and the upper end portion 12a of the roof side inner rail 12. The solar battery module 1 is fixed to an upper surface of the upper end portion 11a.

Subsequently, a configuration of the solar battery module 1 will be described. The solar battery module 1 includes plate-like glass 2 which is able to transmit light, a solar battery cell 3, a sealing material layer 4, a fixation portion 5, a back sheet 6, and a sealing member 7.

The glass 2 is arranged along an upper surface of the vehicle body, and is a rectangular light transmissive plate member having light permeability which transmits solar light. The glass 2 is a plate member having an upper surface (a front surface) 2a on which the solar light is incident. In addition, the glass 2 has a suitable thickness for ensuring strength of the solar battery module 1. The glass 2 may be in the shape of a flat plate shape, or may be in the shape of a curved plate. In this embodiment, the glass 2 is in the shape of a flat plate, and a thickness direction of the glass 2 is identical to the vertical direction. Furthermore, instead of the glass 2, a plate member formed of a light permeability resin such as acryl, polyethylene terephthalate (PET), polyethylene naphthalate (PEN), and polycarbonate may be used.

The glass 2 is arranged over the pair of right and left roof side rails Rs. A lower surface (a back surface) 2b of the glass 2 is adhered to each of the pair of roof side rails Rs. The glass 2 is fixed to the roof side rail Rs by a so-called direct grading method, and an adhesive portion S is disposed between the glass 2 and the roof side rail Rs.

The adhesive portion S is fixed by adhesion between the pair of roof side rails Rs and the glass 2. The adhesive portion S, for example, is formed of a urethane resin. Furthermore, the adhesive portion S is not limited to the adhesive portion formed of the urethane resin, and may be formed of other known adhesive agents.

Specifically, the adhesive portion S is formed between each lower surface 2b of a pair of side end portions 2c and 2d of the glass 2, and each adhesive surface $F_1$ of the pair of roof side rails Rs. The pair of side end portions 2c and 2d in the glass 2 are end portions of the vehicle body in a width direction which face each other in a horizontal direction. The adhesive surface $F_1$ is an upper surface of the roof side rail Rs (the roof side rail reinforcement 11) facing the lower surface 2b of the pair of side end portions 2c and 2d in the vertical direction. The pair of roof side rails Rs includes each of the adhesive surfaces $F_1$. In a solar battery mounting structure, the lower surface 2b of the pair of side end portions 2c and 2d of the glass 2 is adhered to the adhesive surface $F_1$ of the pair of roof side rails Rs.

Furthermore, in the glass 2, not only the lower surface 2b of the pair of side end portions 2c and 2d which face each other in the horizontal direction, but also the lower surface 2b of the pair of side end portions which face each other in a front-back direction is adhered to the vehicle body frame member B (for example, the roof panel reinforcement).

On a center side of the lower surface 2b of the glass 2, the sealing material layer 4 including the solar battery cell 3 therein is disposed. The sealing material layer 4 is disposed between a pair of adhesive portions S. The solar battery cell 3 is an instrument converting light energy into direct power by using a photovoltaic effect, and for example, a silicon-based solar battery cell 3 is used. As the silicon-based solar battery cell 3, any one of a single crystalline silicon-based solar battery cell, a polycrystalline silicon-based solar battery cell, and an amorphous silicon-based solar battery cell may be used. The single crystalline silicon-based solar battery cell has excellent photoelectric conversion efficiency, and the amorphous silicon-based solar battery cell has smaller efficiency degradation due to an increase in temperature. In addition, as the solar battery cell 3, a known solar battery cell is able to be adopted, and a solar battery cell of a compound such as GaAs (gallium arsenide) or an organic solar battery cell, and other solar battery cells may be used.

The sealing material layer 4 is a layer protecting the solar battery cell 3 from being degraded due to moisture, oxygen, or the like by sealing the solar battery cell 3. The sealing material layer 4 is formed of a light permeability resin. Specifically, as the sealing material layer 4, for example, Ethylene Vinyl Acetate (EVA), Poly Vinyl Butyral (PVB), an ion crosslinked polyolefin-based resin, and the like are able to be adopted.

Here, FIG. 2 is a bottom view illustrating the solar battery module 1. In FIG. 2, a front direction Fr of the vehicle body and a back direction Rr of the vehicle body are illustrated by arrows in addition to the upper direction UP of the vehicle body, the left direction L of the vehicle body, and the right direction R of the vehicle body.

As illustrated in FIG. 1 and FIG. 2, a plurality of solar battery cells 3 are arranged on the same plane inside the sealing material layer 4. In this embodiment, as an example, a total of 16 (4 sheets×4 rows) solar battery cells 3 are arranged at predetermined intervals. Furthermore, the number of solar battery cells 3 or an arrangement thereof is not limited to the number of solar battery cells 3 or the arrangement thereof illustrated in FIG. 1 and FIG. 2.

On a side of the sealing material layer 4 opposite to the glass 2 (a lower surface side), a pair of right and left fixation portions 5 are disposed. The fixation portion 5 is fixed to the lower surface 2b of the glass 2 through the sealing material layer 4. The fixation portion 5 is a portion which is fixed to the vehicle body frame member B. Fixation of the fixation portion 5 will be described later in detail.

On the side of the sealing material layer 4 opposite to the glass 2, the back sheet 6 is arranged between the pair of right and left fixation portions 5. The back sheet 6, for example, is a multilayered resin film, and is disposed to cover the sealing material layer 4. In addition, an end portion 6a of the back sheet 6 in the horizontal direction is arranged to be overlapped on the fixation portion 5. The back sheet 6 prevents moisture, oxygen, or the like from invading (infiltration) the sealing material layer 4. Furthermore, it is not necessary that the back sheet 6 be arranged to be overlapped with the fixation portion 5, and for example, a sealing member such as a butyl tape may be disposed to cover a gap between the back sheet 6 and the fixation portion 5.

As a material of the back sheet 6, for example a fluoride resin such as polyvinylidene fluoride (PVF), and an ester resin such as polyethylene terephthalate (PET) are able to be adopted, and as necessary, a metallic film is able to be interposed between layers. The back sheet 6 improves strength of the sealing material layer 4, and contributes to an improvement in durability of the solar battery module 1.

A side of the sealing material layer 4 is covered with the sealing member 7. The sealing member 7 is a member for preventing moisture, oxygen, or the like from invading (infiltrating) the sealing material layer 4. The sealing member 7 is not particularly limited insofar as the sealing material layer 4 is able to be protected by a configuration of the sealing member 7. As the sealing member 7, for example, a butyl tape is able to be adopted.

Subsequently, fixation between the fixation portion 5 and the vehicle body frame member B will be described. Here, the fixation portion 5 and the vehicle body frame member B are mechanically fixed to each other by using a nut 9 and a bolt 10. Furthermore, a fixing method of the fixation portion 5 and the vehicle body frame member B is not limited to the fixing method using the nut 9 and the bolt 10. Other fixing methods will be described later.

First, the fixation portion 5 will be described. The fixation portion 5 is a plate-like resin member which is disposed to cover right and left end portions of the sealing material layer 4 on the side of the sealing material layer 4 opposite to the glass 2. The fixation portion 5 is in the shape of a rectangle of which a longitudinal direction is the front-back direction of the vehicle body. As a material of the fixation portion 5, a polyamide, polypropylene, and polyethylene terephthalate are able to be adopted. Fibers or fillers may be included in these resins. The fixation portion 5 also functions as a sealing member which inhibits moisture, oxygen, or the like from invading (infiltrating) the sealing material layer 4.

Figure 3A:
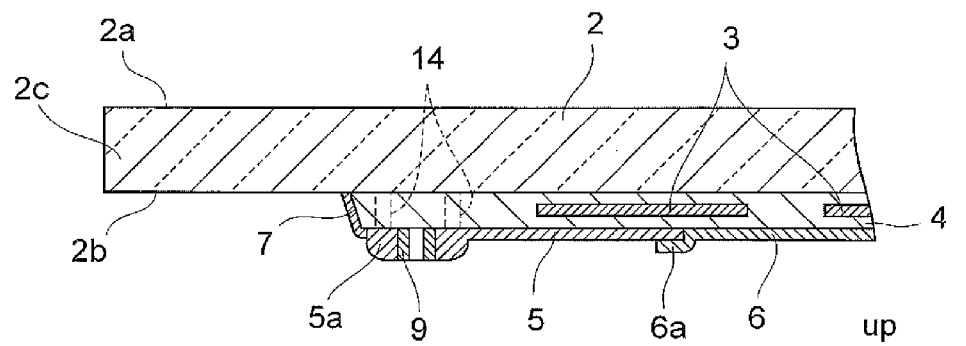
FIG. 3(a) is an enlarged cross-sectional view of the solar battery module of FIG. 1.
Figure 3B:
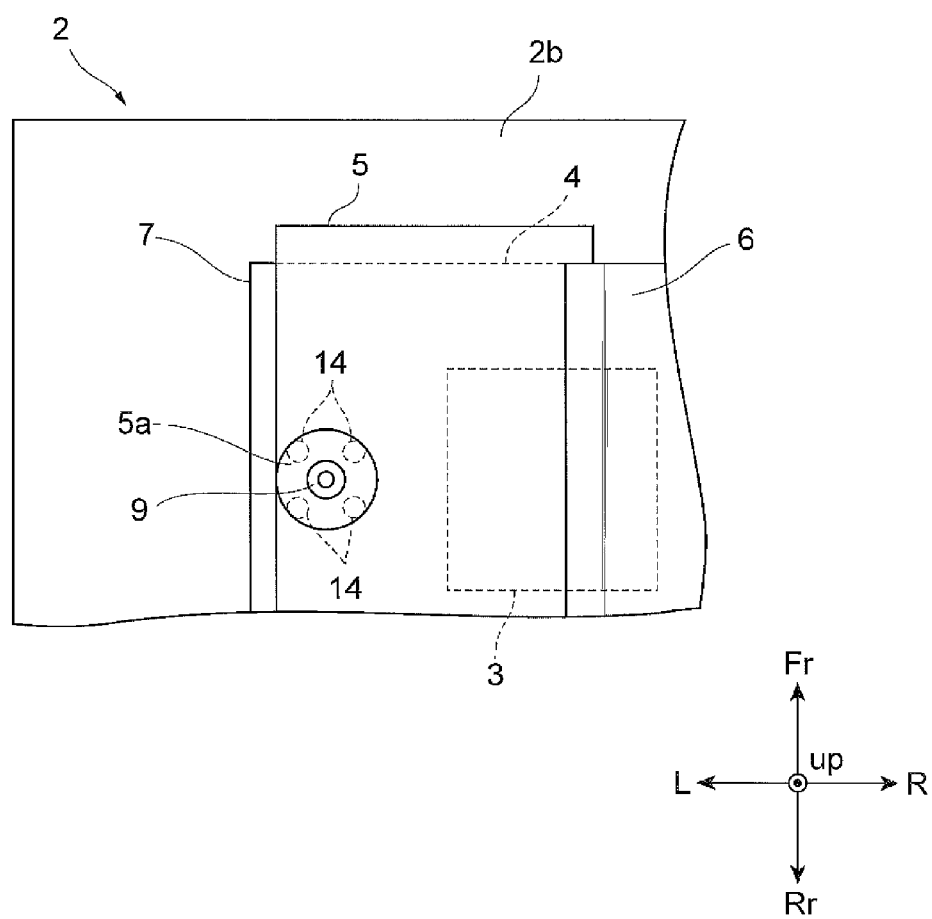
FIG. 3(b) is an enlarged bottom view of the solar battery module of FIG. 2.

Here, FIG. 3(a) is an enlarged cross-sectional view of the solar battery module 1 of FIG. 1. FIG. 3(b) is an enlarged bottom view of the solar battery module 1 of FIG. 2. As illustrated in FIG. 2 and FIGS. 3(a) and 3(b), the fixation portion 5 is molded in a state where the nut 9 is inserted, and includes four thick portions 5a in which the nut 9 is embedded. The four thick portions 5a are formed at predetermined intervals by being arranged in the front-back direction of the vehicle body. The thick portion 5a is formed along an outer side (the sealing member 7 side) of the fixation portion 5 in the horizontal direction. The thick portion 5a is a portion in which a resin is formed to be thick in order to maintain the nut 9 with sufficient strength. Furthermore, a thickness of the fixation portion 5 may be approximately uniform but for the thick portion 5a.

As the nut 9, a known nut is able to be adopted, and for example, an insert nut in which concavities and convexities are formed on an outer circumferential surface is able to be adopted. The nut 9 is embedded in the center of the thick portion 5a such that a female screw portion is exposed when viewed from the bottom. Furthermore, the number of thick portions 5a and the number of nuts 9 are not limited to four, and may be one or more. In addition, the entire thickness of the fixation portion 5 may be identical to a thickness of the thick portion 5a. A size or an arrangement of the nut 9 is not limited to the size or the arrangement illustrated in the drawings.

Figure 4A:
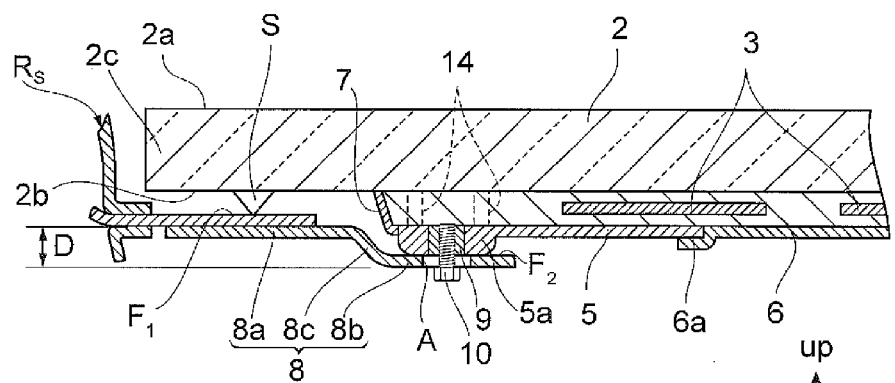
FIG. 4(a) is an enlarged cross-sectional view illustrating the solar battery module fixed to the vehicle body frame member.
Figure 4B:
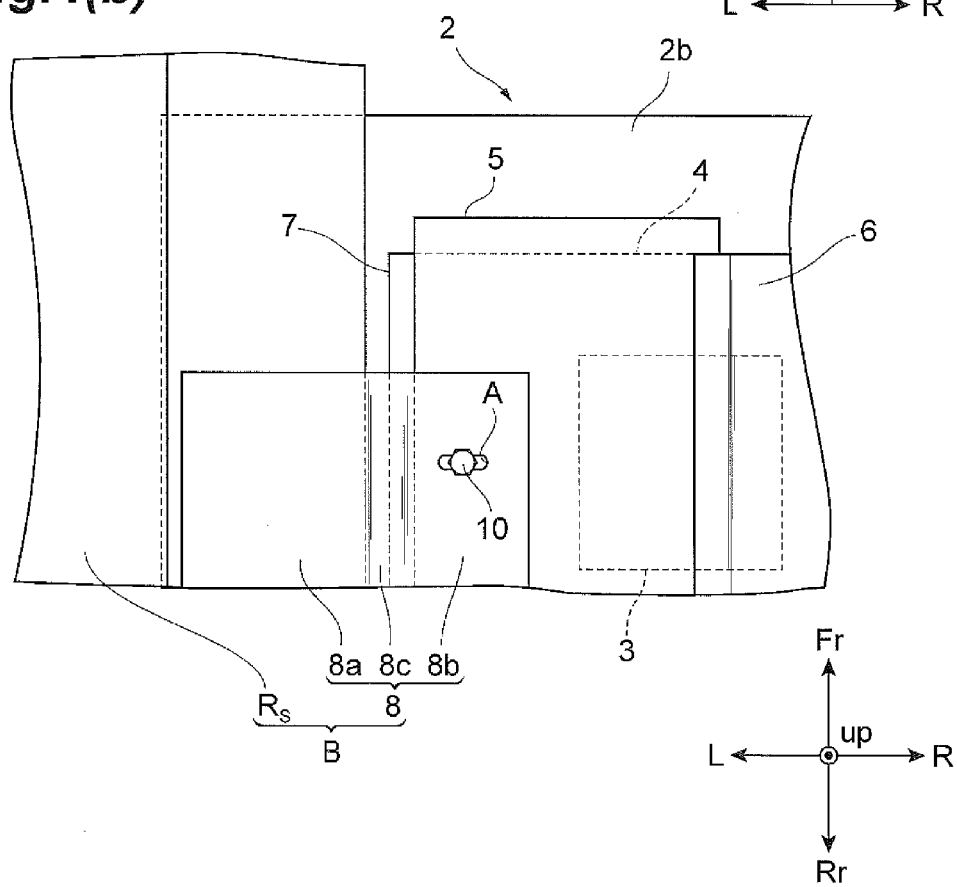
FIG. 4(b) is an enlarged bottom view illustrating the solar battery module fixed to the vehicle body frame member.

FIG. 4(a) is an enlarged cross-sectional view illustrating the solar battery module 1 fixed to the vehicle body frame member B. FIG. 4(a) is an enlarged bottom view illustrating the solar battery module 1 fixed to the vehicle body frame member B. As illustrated in FIG. 1 and FIGS. 4(a) and 4(b), the vehicle body frame member B includes a body bracket 8 which is fixed to the roof side rail Rs.

The body bracket 8, for example, is an elongated metallic plate member extending in the front-back direction of the vehicle body along the fixation portion 5. The body bracket 8 is divided into a base end portion 8a, a tip end portion 8b, and a step portion 8c in the horizontal direction. The base end portion 8a is a portion which is fixed to the roof side rail Rs. Specifically, the base end portion 8a is welded to a back surface (a lower surface) of the adhesive surface $F_1$ of the roof side rail Rs.

The tip end portion 8b is a portion in which a fixation surface $F_2$ fixed to the fixation portion 5 is formed. The fixation surface $F_2$ is a surface of the tip end portion 8b facing the lower surface 2b of the glass 2 in the vertical direction. Specifically, the fixation surface $F_2$ faces the fixation portion 5 in the vertical direction.

In addition, the fixation surface $F_2$ is separated from the lower surface 2b of the glass 2 in the vertical direction compared to the adhesive surface $F_1$. In FIG. 4(a), a difference D between a height of the adhesive surface $F_1$ and a height of the fixation surface $F_2$ is illustrated. The difference D in the heights, for example, may be 3 mm to 10 mm.

In the fixation surface $F_2$ of the tip end portion 8b, a bolt hole A into which the bolt 10 is inserted is formed to be opened. In the fixation surface $F_2$, four bolt holes A corresponding to positions of the four nuts 9 are formed to be opened. The bolt 10 is screwed into the nut 9 of the fixation portion 5 through the bolt hole A, and thus the fixation portion 5 and the body bracket 8 are fixed to each other. That is, the fixation portion 5 of the solar battery module 1 and the fixation surface $F_2$ of the body bracket 8 of the vehicle body frame member B are mechanically fixed to each other by the bolt 10 and the nut 9. As the bolt 10, a known bolt is able to be adopted.

In addition, the bolt hole A is formed as a long hole extending in the horizontal direction. Thus, by forming the bolt hole A as the long hole, the bolt 10 is able to be screwed into the nut 9 through the bolt hole A even when slight displacement of the fixation portion 5 and the fixation surface $F_2$ occurs, and it is possible to make attachment work of the solar battery module 1 easy. Furthermore, an extending direction of the long hole in the bolt hole A is not limited to the horizontal direction, and for example, may be the front-back direction of the vehicle body.

The step portion 8c is a portion which is formed between the base end portion 8a and the tip end portion 8b. The step portion 8c is formed to be lowered as approaching the fixation portion 5, and the tip end portion 8b is positioned below the base end portion 8a. In the vehicle body frame member B, the difference D between the adhesive surface $F_1$ and fixation surface $F_2$ in a height direction due to the step portion 8c is sufficiently ensured.

Furthermore, it is not necessary that the body bracket 8 include four bolt holes A such that one body bracket 8 corresponds to all of the nuts 9, and one body bracket 8 may include only two bolt holes A. In addition, the body bracket 8 may include only one bolt hole A, and may be individually disposed on each nut 9.

In addition, it is not necessary that the vehicle body frame member B include the body bracket 8, and for example, both the adhesive surface $F_1$ and the fixation surface $F_2$ may be formed in the roof side rail Rs. In this case, in the roof side rail Rs, the step portion between the adhesive surface $F_1$ and the fixation surface $F_2$ is also formed. Alternatively, both the adhesive surface $F_1$ and the fixation surface $F_2$ may be formed in the body bracket 8.

In addition, the fixation portion 5 includes a protrusion portion 14 protruding toward the lower surface 2b of the glass 2. Four protrusion portions 14, for example, are disposed in each thick portion 5a (in each nut 9). The four protrusion portions 14 are arranged to surround the nut 9. The four protrusion portions 14, for example, are disposed at equal intervals in a circumferential direction of the nut 9. The protrusion portion 14, for example, is formed into the shape of a column, and is in contact with the lower surface 2b of the glass 2 through the sealing material layer 4.

Furthermore, the number of protrusion portions 14 is not limited to four, and may be one. In addition, an arrangement of the protrusion portion 14 is not limited to the arrangement described above. A shape of the protrusion portion 14 is not limited to a columnar shape, and may have any shape insofar as the protrusion portion 14 is able to be in contact with the lower surface 2b of the glass 2 through the sealing material layer 4. In addition, the protrusion portion 14, for example, is able to be formed of a resin. In this case, the protrusion portion 14 is able to be integrally formed with the fixation portion 5 which is formed of a resin. The protrusion portion 14 may be formed of metal and other materials.

In the solar battery mounting structure according to the first embodiment described above, the glass 2 is adhered to the adhesive surface $F_1$ of the vehicle body frame member B, and further, the fixation portion 5 is fixed to the fixation surface $F_2$ of the vehicle body frame member B, and thus it is possible to increase a fixation point (a connection point) between the solar battery module 1 and the vehicle body frame member B, and it is possible to ensure impact resistance of the solar battery module 1 compared to the related art in which only the glass 2 is fixed to the vehicle body frame member B. In addition, in the solar battery mounting structure, the step portion 8c is formed between the adhesive surface $F_1$ and the fixation surface $F_2$ of the vehicle body frame member B, and the fixation surface $F_2$ is separated from the lower surface 2b of the glass 2 compared to the adhesive surface $F_1$, and thus it is possible to ensure a space for disposing the fixation portion 5 in the sealing material layer 4 compared to a case where the step portion 8c is not included. Accordingly, in the solar battery mounting structure, it is possible to ensure impact resistance of the solar battery module 1 by fixing a portion other than the glass 2 to the vehicle body frame member B, and thus it is advantageous for a reduction in a thickness of the glass 2. This contributes to a reduction in weight of the vehicle on which the solar battery module 1 is mounted.

In addition, in the solar battery mounting structure, the protrusion portion 14 which is formed on the sealing material layer 4 side of the fixation portion 5 is in contact with the lower surface 2b of the glass 2, and thus for example, the fixation portion 5 sinks in the sealing material layer 4 at the time of manufacturing the solar battery module I, and it is possible to avoid displacement from occurring in the position of the fixation portion 5. This improves reliability of a connection between the vehicle body frame member B and the solar battery module 1, and thus contributes to an improvement in impact resistance of the solar battery module 1.

In addition, in the solar battery mounting structure, by including the body bracket in the vehicle body frame member B, it is possible to dispose the fixation surface $F_2$ in a suitable position in the vehicle body having various shapes, and thus general versatility is improved.

Further, in the solar battery mounting structure, the nut 9 and the bolt 10 in the fixation portion 5 are screwed in a state where a shaft portion of the bolt 10 is inserted into the bolt hole A in the fixation surface $F_2$ of the vehicle body frame member B, and thus it is possible to fix the fixation portion 5 of the solar battery module 1 to the fixation surface $F_2$ of the vehicle body frame member B in a comparatively easy configuration. In addition, in the solar battery mounting structure, the step portion 8c is formed between the adhesive surface $F_1$ and the fixation surface $F_2$ in the vehicle body frame member B, and thus it is possible to ensure an arrangement space of the nut 9 by the step, and it is possible to obtain necessary strength by sufficiently taking a length for screwing the nut 9 and the bolt 10.

Figure 5A:
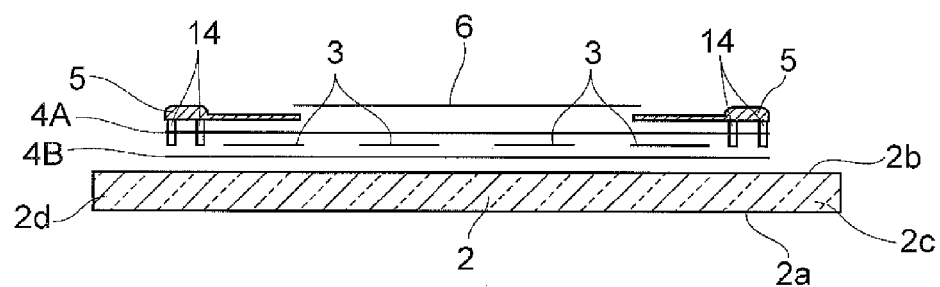
FIG. 5(a) is a cross-sectional view (a cross-sectional view along a thickness direction of glass) illustrating a step of arranging members in a manufacturing method of the solar battery module according to the first embodiment.
Figure 5B:
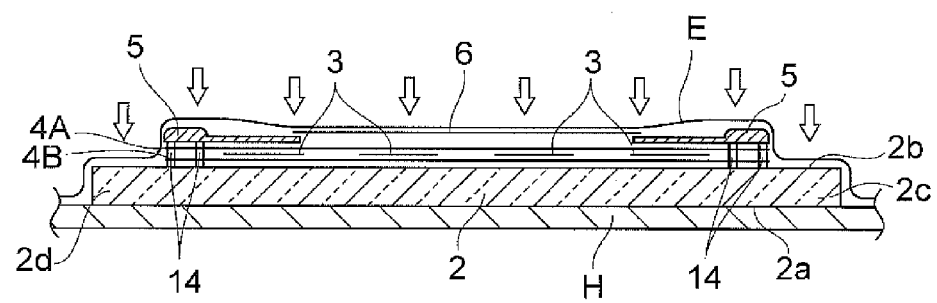
FIG. 5(b) is a cross-sectional view (a cross-sectional view along the thickness direction of the glass) illustrating a laminating step of the solar battery module according to the first embodiment.

Next, the manufacturing method of the solar battery module 1 according to the first embodiment will be described with reference to FIGS. 5(*a*) and 5(*b*). FIG. 5(*a*) is a cross-sectional view illustrating a step of arranging members in the manufacturing method of the solar battery module 1. FIG. 5(*b*) is a cross-sectional view illustrating a laminating step in the manufacturing method of the solar battery module 1. In FIG. 5(*a*) and FIG. 5(*b*), the solar battery module 1 is illustrated as being upside down from FIG. 1.

First, the step of arranging the members illustrated in FIG. 5(*a*) will be described. In the step of arranging the members, as a base of the glass 2, various members are arranged on the lower surface 2b of the glass 2. Specifically, a second sealing material sheet 4B, the solar battery cell 3, a first sealing material sheet 4A, the fixation portion 5, and the back sheet 6 are laminated on the lower surface 2b of the glass 2 in this order. The sealing material sheets 4A and 4B are pressurized by the laminating step described later, and thus the sealing material layer 4 is formed.

At this time, the fixation portion 5 is arranged such that the protrusion portion 14 is in contact with the lower surface 2b of the glass 2 through the first sealing material sheet 4A and the second sealing material sheet 4B. Furthermore, in the first sealing material sheet 4A and the second sealing material sheet 4B, a hole into which the protrusion portion 14 is inserted may be formed in advance. In addition, in the fixation portion 5, the nut 9 is embedded in advance.

Subsequently, the laminating step illustrated in FIG. 5(*b*) will be described. In the laminating step, each glass 2 on which the various members are arranged in the step of arranging the members is input into a laminator, and is pressurized at a high temperature and a uniform pressure. In the laminator, the glass 2 is arranged on a heat plate H, and the various members on each of the glasses 2 are covered with rubber E of the laminator. In this state, the glass 2 is pressed by a metallic mold while being heated by the heat plate H, and thus each sheet is pressurized. After finishing the laminating step, the sealing member 7 is arranged to cover the side of the sealing material layer 4 which is solidified at time intervals. Thus, the solar battery module 1 is manufactured.

According to the manufacturing method of the solar battery module 1 according to the first embodiment described above, formation of the sealing material layer 4 and attachment of the fixation portion 5 are able to be performed at once in the laminating step, and thus it is possible to efficiently manufacture the solar battery module 1. Furthermore, the fixation portion 5 is able to be formed of a resin of which a softening temperature is greater than or equal to 120° C. in order to avoid the fixation portion 5 from being softened in the laminating step.

Second Embodiment

Figure 6:
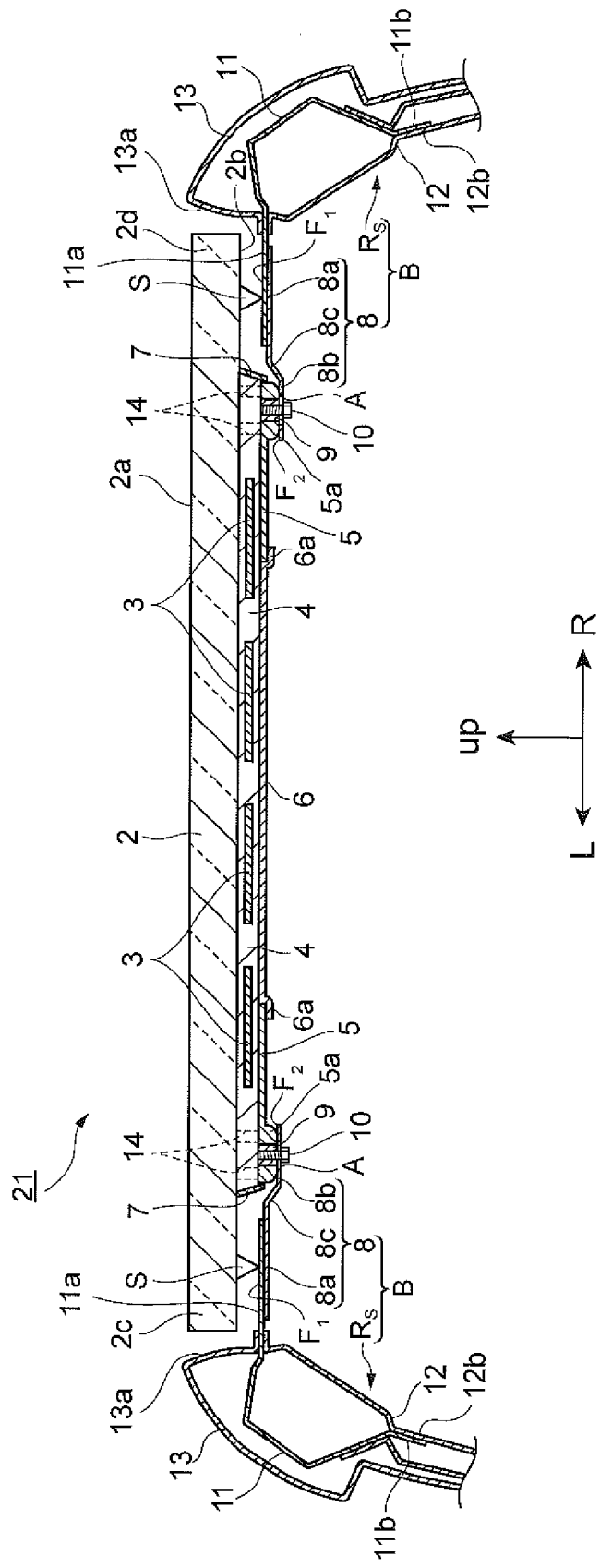
FIG. 6 is a cross-sectional view illustrating a solar battery mounting structure according to a second embodiment.
Figure 7:
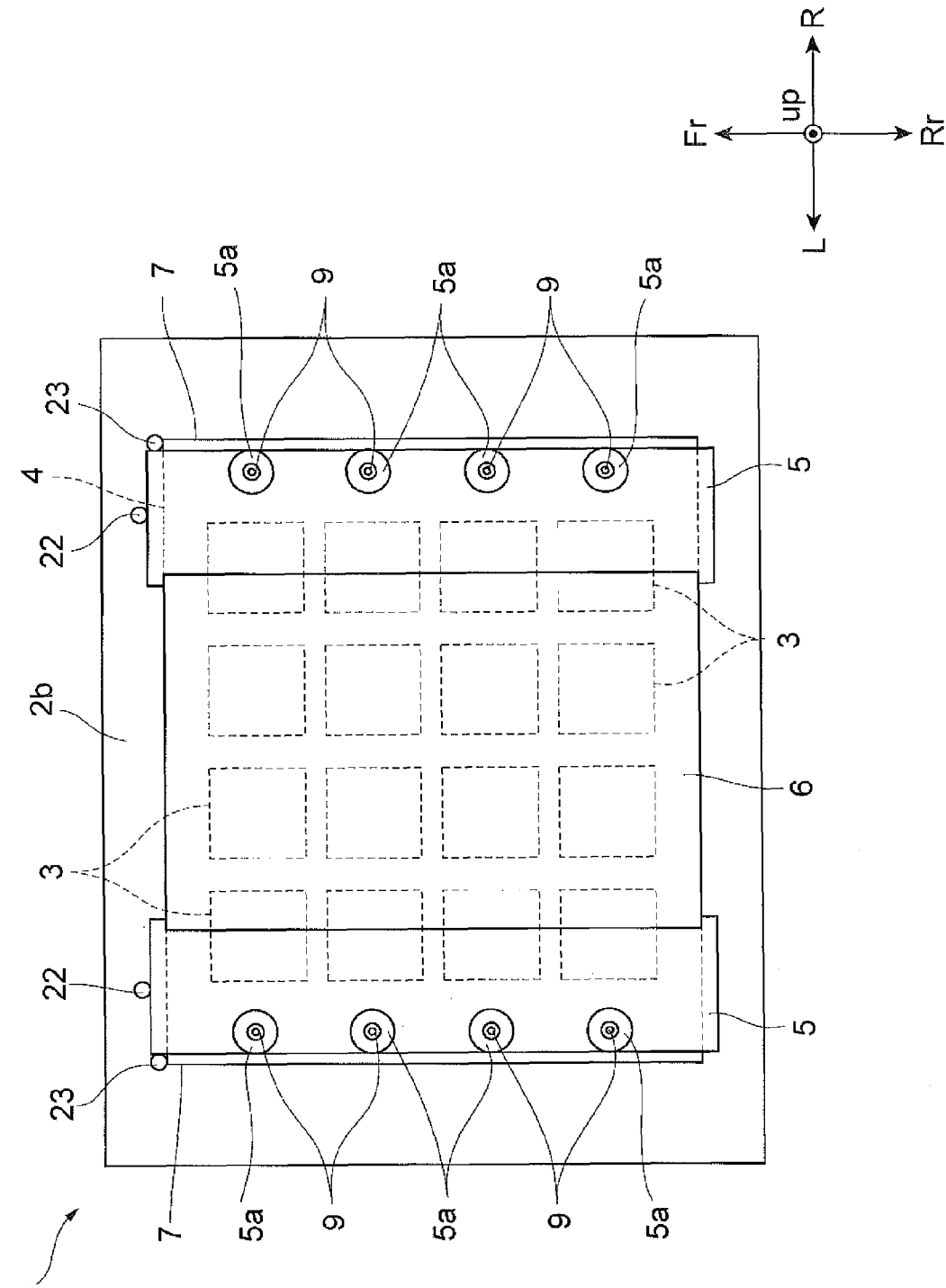
FIG. 7 is a bottom view illustrating a solar battery module of FIG. 6.

FIG. 6 is a cross-sectional view illustrating a solar battery mounting structure according to a second embodiment. FIG. 7 is a bottom view illustrating a solar battery module 21 according to the second embodiment. FIG. 8(*a*) is an enlarged cross-sectional view of the solar battery module 21 of FIG. 6. FIG. 8(*b*) is an enlarged bottom view of the solar battery module 21 of FIG. 7.

As illustrated in FIG. 6 to FIG. 8(*b*), the solar battery mounting structure according to the second embodiment is different from the solar battery mounting structure according to the first embodiment in that positioning pins 22 and 23 are disposed in the lower surface 2b of the glass 2. Furthermore, the same reference numeral is applied to a configuration which is identical to or corresponds to that of the first embodiment, and the repeated description will be omitted.

As illustrated in FIG. 7 and FIGS. 8(*a*) and 8(*b*), the positioning pins 22 and 23 are disposed in the lower surface 2b of the glass 2. The positioning pins 22 and 23 are a pin for positioning the fixation portion 5 with respect to the lower surface 2b of the glass 2. The positioning pins 22 and 23 are adhered to the lower surface 2b of the glass 2.

The fixation portion 5 is positioned on the lower surface 2b by the positioning pin 22 which is positioned in the front direction Fr of the vehicle body when viewed from the fixation portion 5, and by the positioning pin 23 which is positioned on an outer side in the horizontal direction. That is, among four side surfaces of the fixation portion 5, a side surface in the front direction Fr is in contact with the positioning pin 22, and a side surface positioned on an outer side of the vehicle body in the horizontal direction is in contact with the positioning pin 23, and thus the fixation portion 5 is positioned with respect to the lower surface 2b of the glass 2.

In other words, the respective positioning pins 22 and 23 are in contact with two sides among four sides of the rectangular fixation portion 5 when viewed from the vertical direction, and thus the fixation portion 5 is positioned. Furthermore, the number of positioning pins 22 and 23 or an arrangement thereof is not limited to the number of positioning pins 22 and 23 or the arrangement thereof described above, and three or more positioning pins may be used.

Figure 9A:
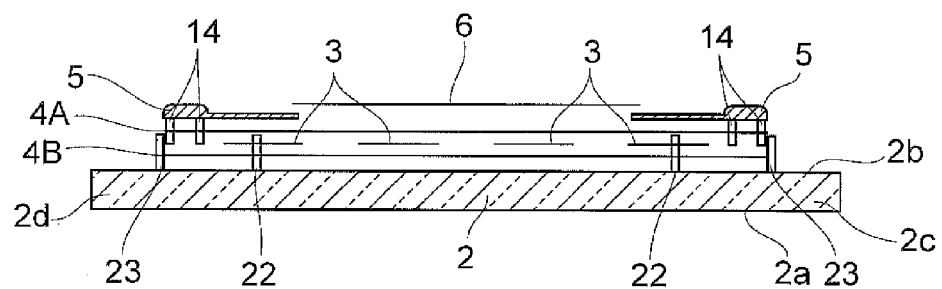
FIG. 9(a) is a cross-sectional view (a cross-sectional view along a thickness direction of glass) illustrating a step of arranging members in a manufacturing method of the solar battery module according to the second embodiment.
Figure 9B:
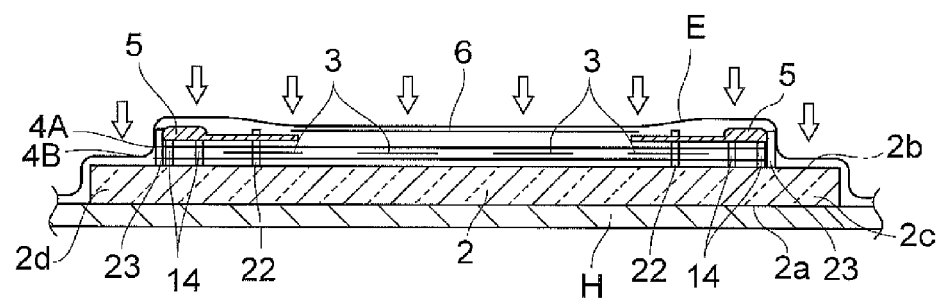
FIG. 9(b) is a cross-sectional view (a cross-sectional view along the thickness direction of the glass) illustrating a laminating step in the manufacturing method of the solar battery module according to the second embodiment.

Here, a manufacturing method of the solar battery module 21 according to the second embodiment will be described with reference to FIGS. 9(a) and 9(b). FIG. 9(a) is a cross-sectional view (a cross-sectional view along the thickness direction of the glass) illustrating a step of arranging members in the manufacturing method of the solar battery module according to the second embodiment. FIG. 9(b) is a cross-sectional view (a cross-sectional view along the thickness direction of the glass) illustrating a laminating step in the manufacturing method of the solar battery module according to the second embodiment. Furthermore, a procedure of the step of arranging the members and the laminating step is identical to that of the first embodiment.

First, the step of arranging the members illustrated in FIG. 9(a) will be described. Here, in the lower surface 2b of the glass 2, the positioning pins 22 and 23 are disposed in advance. In the step of arranging the members, the second sealing material sheet 4B, the solar battery cell 3, the first sealing material sheet 4A, the fixation portion 5, and the back sheet 6 are laminated on the lower surface 2b of the glass 2 in this order. At this time, the fixation portion 5 is positioned with respect to the lower surface 2b of the glass 2 by being in contact with the positioning pins 22 and 23.

Subsequently, the laminating step illustrated in FIG. 9(b) will be described. In the laminating step, each of the glasses 2 on which the various members are arranged in the step of arranging the members is input into the laminator, and is pressurized at a high temperature and a uniform pressure. In the laminator, the glass 2 is pressed by the metallic mold while being heated by the heat plate H, and thus first sealing material sheet 4A and the second sealing material sheet 4B are pressurized. At this time, the fixation portion 5 is positioned with respect to the lower surface 2b of the glass 2 by the positioning pins 22 and 23, and thus the fixation portion 5 moves over the sealing material layer 4 and avoids position displacement. Further, the protrusion portion 14 is in contact with the lower surface 2b of the glass 2 through sealing material layer 4, and thus the fixation portion 5 does not sink in the sealing material layer 4 and avoids the position displacement in the vertical direction. After finishing the laminating step, the sealing member 7 is arranged to cover the side of the sealing material layer 4 which is solidified at time intervals. Thus, the solar battery module 21 is manufactured.

In the solar battery mounting structure according to the second embodiment described above, the same effects as those of the solar battery mounting structure according to the first embodiment are able to be obtained. Further, in the solar battery mounting structure, the fixation portion 5 is positioned with respect to the lower surface 2b of the glass 2 by the positioning pins 22 and 23, and thus for example, it is possible to avoid the position displacement of the fixation portion 5 from occurring along the sealing material layer 4 at the time of manufacturing the solar battery module 21. Accordingly, in the solar battery mounting structure, it is possible to suppress the position displacement of the fixation portion 5, and thus it is possible to improve stability of the fixation between the vehicle body frame member B and the solar battery module 1.

As described above, the embodiment of the invention is described, but the structure of the invention is not limited to the embodiment described above. For example, the solar battery module 1 is not disposed immediately on the vehicle body, but may be disposed on a front side of the vehicle body, a back side of the vehicle body, and an inclined surface portion of a lateral side of the vehicle body insofar as such portions are in the upper surface of the vehicle body. In addition, in the solar battery module 1 according to the second embodiment, it is not necessary that the positioning pins 22 and 23 be disposed.

In addition, the fixation between the fixation portion of the solar battery module and the fixation surface of the vehicle body frame member is not limited to the structure described above. Specifically, one end of a rod material including a screw groove may be embedded in the fixation portion instead of the nut. In this case, the nut is screwed from a tip end of the rod material protruding from the bolt hole in a state where the rod material passes through the bolt hole of the fixation surface, and thus it is possible to realize the fixation between the fixation portion and the fixation surface. In addition, the rod material may include a through hole which is perpendicular to a center shaft of the rod material on the tip end side instead of the screw groove. In this case, a retaining member is inserted into the through hole on the tip end side protruding from the bolt hole in a state where the rod material is inserted into the bolt hole of the fixation surface, and thus it is possible to realize the fixation between the fixation portion and the fixation surface. Furthermore, in mechanical fixation, there may be slight looseness.

In addition, in the fixation portion, a base end side of an L-shaped or a flat plate-like metallic plate including a through hole on a tip end side may be embedded. In this case, the through hole of the metallic plate and a hole in the fixation surface of the vehicle body frame member are caulked in a state of being matched with each other through a rivet and other caulking members, and thus it is possible to realize the fixation between the fixation portion and the fixation surface. In addition, the fixation portion of the solar battery module and the fixation surface of the vehicle body frame member may be fixed to each other by adhesion.

What is claimed is:
1. A solar battery mounting structure comprising:
a vehicle body including a vehicle body frame member; and
a solar battery module including:
  a light transmissive plate member which is arranged along the upper surface of the vehicle body;
  an adhesive portion by which a lower surface of a side end portion of the light transmissive plate member is adhered to an adhesive surface of the vehicle body frame member;
  a fixation portion which is fixed to a lower surface of the light transmissive plate member through a sealing material layer, and is fixed to a fixation surface of the vehicle body frame member facing the lower surface; and
  a protrusion portion which is in contact with the lower surface of the light transmissive plate member through the sealing material layer is formed in the fixation portion;
wherein the solar battery module is disposed in an upper surface of the vehicle body;
wherein the solar battery module is fixed to the vehicle body frame member;
wherein a step portion is formed in the vehicle body frame member between the adhesive surface and the fixation surface; and wherein the fixation surface is separated from the lower surface of the light transmissive plate member compared to the adhesive surface.

2. The solar battery mounting structure according to claim 1,
wherein the vehicle body frame member includes a body bracket protruding toward the fixation portion, and
the fixation surface is formed in the body bracket.

3. The solar battery mounting structure according to claim 1,
wherein the fixation portion includes a resin member in which a nut is embedded,
the fixation surface has a bolt hole opened therein, and
the fixation portion is fixed to the fixation surface by a bolt screwed into the nut through the bolt hole.

4. The solar battery mounting structure according to claims 1,
wherein a plurality of positioning pins for positioning the fixation portion at the time of manufacturing the solar battery module are disposed in the lower surface of the light transmissive plate member.

5. The solar battery mounting structure according to claims 1, further comprising:
a back sheet which is disposed on a side of the sealing material layer opposite to the light transmissive plate member.

* * * * *